United States Patent
Kunitake et al.

(10) Patent No.: US 8,760,908 B2
(45) Date of Patent: Jun. 24, 2014

(54) NON-VOLATILE SEMICONDUCTOR MEMORY DEVICE

(75) Inventors: Tetsuji Kunitake, Kuwana (JP); Kenichi Murooka, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 13/235,431

(22) Filed: Sep. 18, 2011

(65) Prior Publication Data

US 2012/0075913 A1 Mar. 29, 2012

(30) Foreign Application Priority Data

Sep. 24, 2010 (JP) ................................ 2010-213788

(51) Int. Cl.
*G11C 11/00* (2006.01)

(52) U.S. Cl.
USPC ........................................................ 365/148

(58) Field of Classification Search
USPC ............. 365/46, 94, 100, 113, 129, 148, 163; 257/2–5, 296, E31.047, E27.006; 438/29, 95, 96, 166, 259, 365, 482, 438/486, 597; 977/754
See application file for complete search history.

(56) References Cited

U.S. PATENT DOCUMENTS

| | | | |
|---|---|---|---|
| 7,907,436 B2 | 3/2011 | Maejima | |
| 7,911,854 B2 | 3/2011 | Nagashima | |
| 2007/0242528 A1* | 10/2007 | Inoue | 365/189.01 |
| 2009/0296459 A1* | 12/2009 | Kim et al. | 365/163 |
| 2010/0118593 A1* | 5/2010 | Cho et al. | 365/148 |
| 2011/0026299 A1* | 2/2011 | Kanno et al. | 365/148 |
| 2011/0228586 A1* | 9/2011 | Kawabata et al. | 365/148 |
| 2011/0305070 A1* | 12/2011 | Ishihara | 365/148 |

FOREIGN PATENT DOCUMENTS

| | | |
|---|---|---|
| JP | 2007-226883 | 9/2007 |
| JP | 4231502 | 12/2008 |
| JP | 2009-080901 | 4/2009 |
| JP | 2009-158020 | 7/2009 |
| JP | 2009-193629 | 8/2009 |
| JP | 2009-230849 | 10/2009 |
| JP | 2010-55719 | 3/2010 |

OTHER PUBLICATIONS

Office Action issued in Japanese Patent Application No. 2010-213788, filed Sep. 24, 2010 (with English-language translation).

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

A nonvolatile semiconductor memory device includes: a memory cell array which has a plurality of first lines, a plurality of second lines intersecting the plurality of first lines and a plurality of memory cells which store an electrically rewritable resistance value as data in a non-volatile manner; a first decoder which is connected to one ends of the plurality of first lines and selects the first lines; a second decoder which is connected to the plurality of second lines and selects the second lines; and a voltage applying circuit which is connected to one of the first and second decoders and which applies a predetermined voltage between the first and second lines selected by the first and second decoders. The second decoder sequentially selects the second lines in a direction from the other ends to the one ends of the first lines.

20 Claims, 8 Drawing Sheets

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2010-213788, filed on Sep. 24, 2010, the entire contents of which are incorporated herein by reference.

BACKGROUND

1. Field

Embodiments disclosed herein relate to a non-volatile semiconductor memory device.

2. Description of the Related Art

In recent years, as succeeding candidates of flash memories, resistance change memory devices which use variable resistance elements as memory elements are gaining attention. Meanwhile, the resistance change memory devices include, for example, a narrowly-defined resistive RAM (ReRAM) which stores a resistance value state of a transition metal oxide in a non-volatile manner using the transition metal oxide for a recording layer, and a phase change RAM (PCRAM) which utilizes resistance value information of a crystalline state (conductor) and non-crystalline state (insulator) of chalcogenide using, for example, chalcogenide for a recording layer.

Memory cells of the resistance change memory device are known to have two types of operation modes. One mode is directed to setting a high-resistance state and a low-resistance state by switching the polarity of an applied voltage, and is referred to as "bipolar type". The other one is directed to setting a high-resistance state and a low-resistance state by controlling a voltage value and a voltage application time without switching the polarity of the applied voltage, and is referred to as "unipolar type".

To realize a high density memory cell array in a resistance change memory device, the cell array is formed by overlaying variable resistance elements and rectifying elements such as diodes on intersection parts of bit lines and word lines. Further, by providing a three-dimensional layered alignment of this memory cell array, it is possible to realize a large capacity without increasing a cell array area.

To function the resistance change elements as memory cells of the resistance change memory, it is necessary to perform forming as an initial setting operation. This forming is performed by applying a high predetermined voltage compared to data writing to variable resistance elements, forming current paths in the variable resistance elements and setting a predetermined resistance state, for example, a low-resistance state. Data is written in the memory cells for which this forming is performed, by applying a predetermined voltage to variable resistance elements for a short time in case of a unipolar type ReRAM. As a result, the variable resistance elements change from a high-resistance state to a low-resistance state. Hereinafter, an operation of changing these variable resistance elements from a high-resistance state to a low-resistance state is referred to as a setting operation. By contrast with this, data is erased from the memory cell by applying a low predetermined voltage compared to the setting operation for a long time, to the variable resistance elements in the low-resistance state after the setting operation. By this operation, the variable resistance elements change from a low-resistance state to a high-resistance state. Hereinafter, an operation of changing these variable resistance elements from a low-resistance state to a high-resistance state is referred to as a resetting operation. The memory cell, for example, places a high-resistance state in a stable state (reset state) and, to store binary data, writes data by the setting operation of changing the reset state to the low-resistance state.

With this resistance change memory device, upon forming, setting or resetting, a consumption current increases, or error setting or error resetting occurs due to a leak current to the memory cells other than target memory cells or wiring resistance.

DETAILED DESCRIPTION

The non-volatile semiconductor memory device according to the embodiments has: a memory cell array which has a plurality of first lines, a plurality of second lines intersecting the plurality of first lines and a plurality of memory cells which are arranged at each intersection part of the plurality of first and second lines and which store an electrically rewritable resistance value as data in a non-volatile manner; a first decoder which is connected to one ends of the plurality of first lines and selects the first lines; a second decoder which is connected to one ends of the plurality of second lines and selects the second lines; and a voltage applying circuit which is connected to one of the first decoder and the second decoder and which applies a predetermined voltage between the first lines and the second lines selected by the first decoder and the second decoder. The second decoder sequentially selects the second lines in a direction from the other ends to the one ends of the first lines.

Hereinafter, embodiments of the present invention will be described with reference to the accompanying drawings. With the present embodiment, a non-volatile semiconductor memory device will be described as a resistance change memory device using variable resistance elements for memory cells. However, this configuration is an example, and the present invention is by no means limited to this.

[First Embodiment]

[Entire Configuration]

Figure 1:
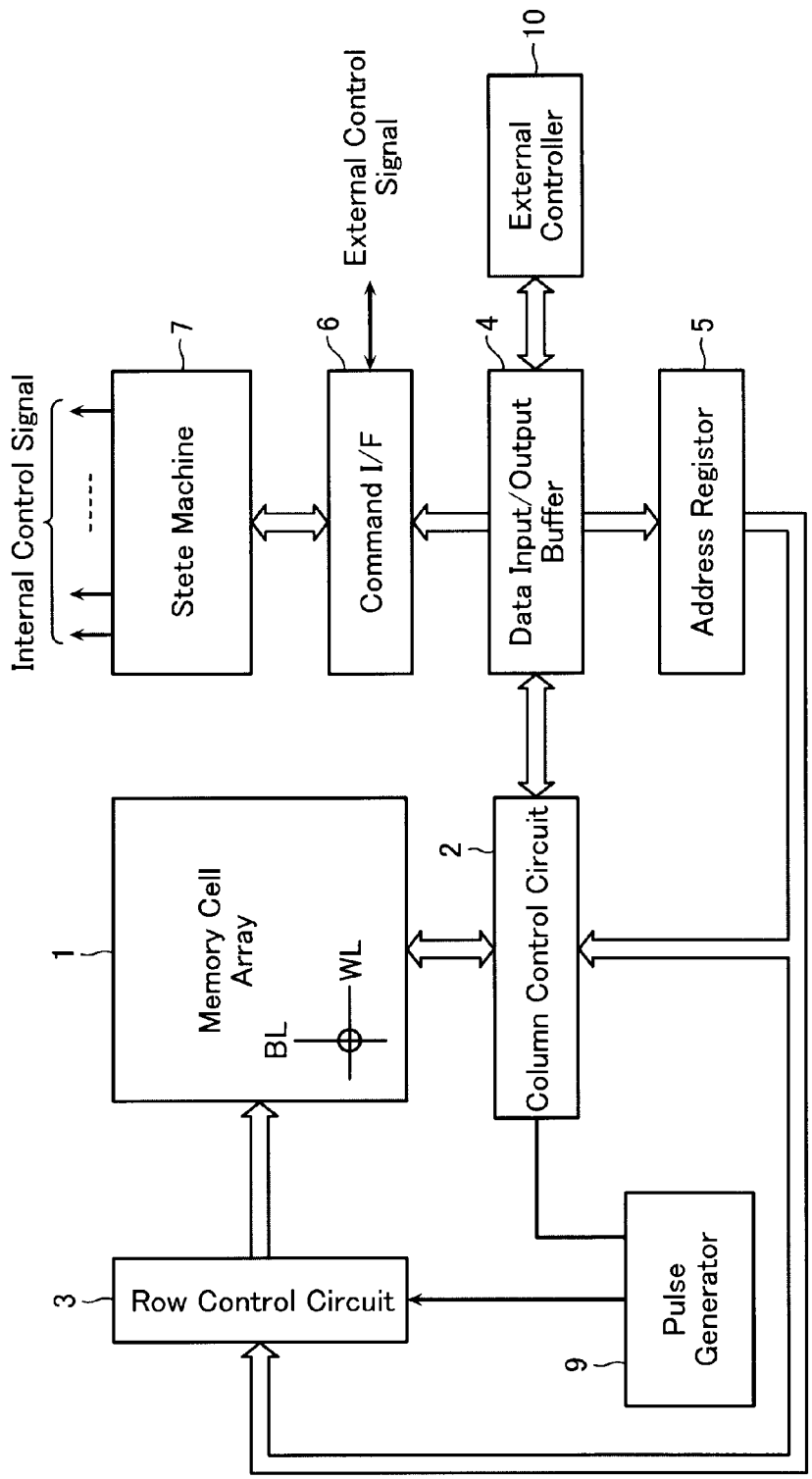
FIG. 1 is a block diagram of a non-volatile semiconductor memory device according to a first embodiment.

FIG. 1 is a block diagram of a non-volatile semiconductor memory device according to the first embodiment.

This non-volatile semiconductor memory device includes a memory cell array 1 in which memory cells using ReRAM (variable resistance elements) which will be described later are arranged in a matrix pattern. In a position of the memory cell array 1 adjacent in a bit line BL direction, a column control circuit 2 is provided which controls bit lines BL of the memory cell array 1, erases data of memory cells, writes data in the memory cells and reads data from the memory cells. Further, in a position of the memory cell array 1 adjacent in a word line WL direction, a row control circuit 3 is provided which selects word lines WL of the memory cell array 1, erases data from the memory cells, writes data in the memory cells and applies the voltage required to read data from the memory cells.

A data input/output buffer 4 is connected to an external controller 10 through an I/O line and, for example, receives write data, receives an erase command, outputs read data, receives address data or command data, and receives a flag output according to a resistance state of the memory cell array 1. Further, the data input/output buffer 4 outputs the received write data to the column control circuit 2, and receives data read from the column control circuit 2 to output to the outside. An address supplied from the outside to the data input/output buffer 4 is output to the column control circuit 2 and row control circuit 3 through an address register 5. Further, a command supplied from the external controller 10 to the data input/output buffer 4 is output to a command interface 6. The command interface 6 receives an external control signal from the external controller 10, decides whether or not data input to the data input/output buffer 4 is write data, a command or an address and, if the data is command, transfers the command to a state machine 7 as a received command signal. The state machine 7 entirely manages this semiconductor memory device, and receives a command from the external controller 10, and reads, writes, erases, and manages an input and output of data. Further, the external controller 10 can decide whether or not it is possible to write and erase data, by receiving status information managed by the state machine 7. This status information is also used to perform control to write and erase data.

Further, the state machine 7 controls a pulse generator 9 which is a voltage supply circuit. According to this control, the pulse generator 9 can output a pulse of a given voltage at given timing. More specifically, the state machine 7 receives an input of an address given from the outside through the address register 5, decides to which memory layer the access is made, and controls the height and width of the pulse of the pulse generator 9 using a parameter matching the memory layer. This parameter is a value determined such that, for example, write characteristics of each memory layer are made uniform based on characteristics of each memory layer relating a write control, and is stored in the memory cells. The formed pulse can be transferred to certain lines selected by the column control circuit 2 and the row control circuit 3.

In addition, peripheral circuit elements other than the memory cell array 1 can be formed on a silicon substrate right below the memory cell array 1, so that it is possible to make a chip area of this semiconductor memory device almost equal to the area of the memory cell array 1.

[Memory Block]

Figure 2:
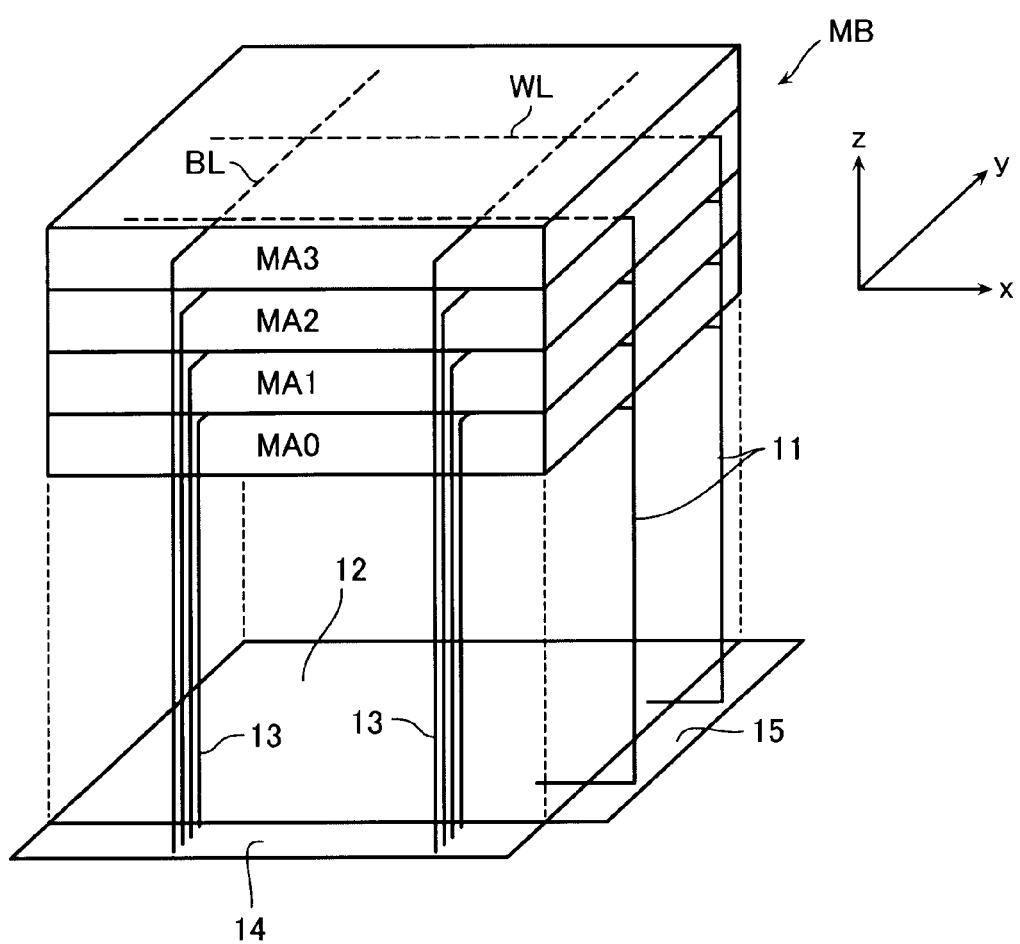
FIG. 2 is a perspective view illustrating a configuration of a memory cell array of a non-volatile semiconductor memory device according to the first embodiment.

FIG. 2 illustrates a basic configuration of a resistance change memory device according to the first embodiment, that is, configurations of a wiring area 12 in which wirings such as global buses on the semiconductor substrate are formed, and a memory block MB layered on the wiring area 12.

As illustrated in FIG. 2, the memory block MB is formed with four memory cell arrays MA0 to MA3 according to this example. The wiring area 12 is provided on a semiconductor substrate right below the memory block MB. On the wiring area 12, for example, global buses are provided which exchange, with the outside, data written and read in and from the memory block MB. Further, on this wiring area 12, the column control circuit 2 which includes, for example, a column switch described later, and the row control circuit 3 which includes, for example, a row decoder may be provided.

Vertical wirings (via contacts) are required on lateral surfaces of the memory block MB to connect the word lines WL and bit lines BL of each layered memory cell array MA, and the wiring area 12 formed on the semiconductor substrate. In the surrounding of the wiring area 12, a bit line contact area 14 and a word line contact area 15 are provided. On the bit line contact area 14 and word line contact area 15, bit line contacts 13 and word line contacts 11 are formed to connect the bit lines BL, word lines WL and control circuit. One ends of the word lines WL are connected to the wiring area 12 through the word line contacts 11 formed on the word line contact area 15. Further, one ends of the bit lines BL are connected to the wiring area 12 through the bit line contacts 13 formed on the bit line contact area 14.

Although FIG. 2 illustrates one memory block MB in which a plurality of memory cell arrays MA are layered on the semiconductor substrate 1 in a vertical direction (a z direction illustrated in FIG. 2), a plurality of these unit memory blocks MB are actually arranged in a matrix pattern in a longitudinal direction of the word lines WL (x direction illustrated in FIG. 2) and longitudinal direction of the bit lines BL (y direction illustrated in FIG. 2).

As illustrated in FIG. 2, in the present embodiment, in the word line contact area 15, the word lines WL extracted from one side of the memory cell array 1 are respectively connected to the wiring area 12 through a common contact. Further, in the bit line contact area 14, the bit lines BL of each layer are connected to the wiring area 12 through contacts of four columns separately prepared. Although, in the present embodiment, the bit lines BL in each layer are independently driven, and the word lines WL are commonly connected to all layers, the word lines WL in each layer may also be independently driven. Further, the bit lines BL may be commonly driven, and the word lines WL may be independently driven. Further, at least one of the bit lines BL and word lines WL may be configured to be shared between upper and lower layers.

Figure 3:
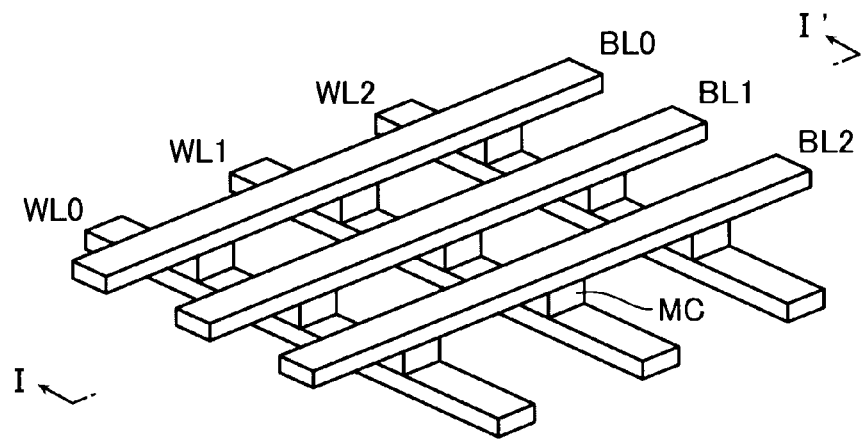
FIG. 3 is a perspective view of part of a memory cell array of a non-volatile semiconductor memory device according to the first embodiment.
Figure 4:
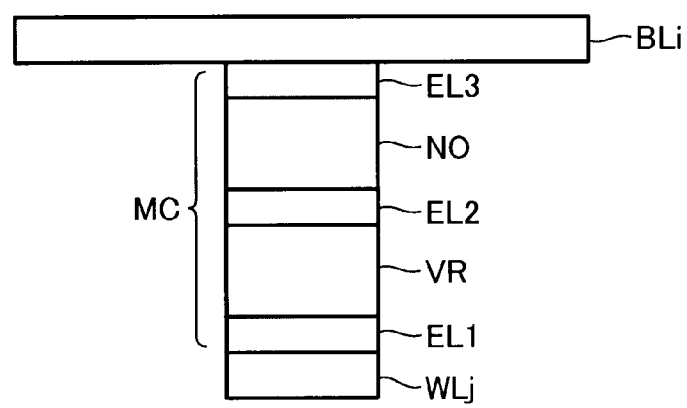
FIG. 4 is a sectional view of one memory cell seen from an arrow direction when the memory cell is cut along an I-I' line in FIG. 3.

FIG. 3 is a perspective view of part of the memory cell array 1, and FIG. 4 is a sectional view of one memory cell MC seen from an arrow direction when the memory cell MC is cut along an I-I' line in FIG. 3.

The word lines WL0 to WL2 are disposed in parallel as a plurality of first lines, the bit lines BL0 to BL2 are disposed in parallel as a plurality of second lines to intersect the plurality of first lines, and the memory cell MC is arranged at each of these intersection parts such that the memory cell MC is sandwiched by the both lines. The first and second lines are, for example, made of materials having high thermal resistance and a low resistance value, and, for example, W, WSi, NiSi or CoSi may be used.

As illustrated in FIG. 4, the memory cell MC is formed with a serially-connected circuit of a variable resistance element VR and non-ohmic element NO.

The variable resistance element VR can change a resistance value by means of a current, heat or chemical energy by applying the voltage, and electrodes EL1 and EL2 which function as a barrier metal and adhesive layer are arranged below and above the variable resistance element VR. For example, Pt, Au, Ag, TiAlN, SrRuO, Ru, RuN, Ir, Co, Ti, TiN, TaN, LaNiO, Al, PtIrOx, PtRhOx or Rh/TaAlN may be used for electrode materials. Further, it is also possible to insert a metal film which makes the orientation uniform. Further, it is also possible to additionally insert, for example, a buffer layer, barrier metal layer and adhesive layer.

For variable resistance elements VR, an element (PCRAM) such as chalcogenide which changes a resistance value by performing phase transfer of a crystalline state and non-crystalline state, an element (CBRAM) which changes a resistance value by precipitating metal cations and forming a bridge (contacting bridge) between electrodes or ionizing the precipitated metal and breaking the bridge, or an element (ReRAM) which changes a resistance value by applying the voltage or current (roughly classified into an element which changes resistance depending on whether or not there is a trapped charge in a charge trap on the electrode interface, and an element which changes resistance depending on whether or not there is a conduction path caused by deficiency of oxygen) may be used.

Figure 5:
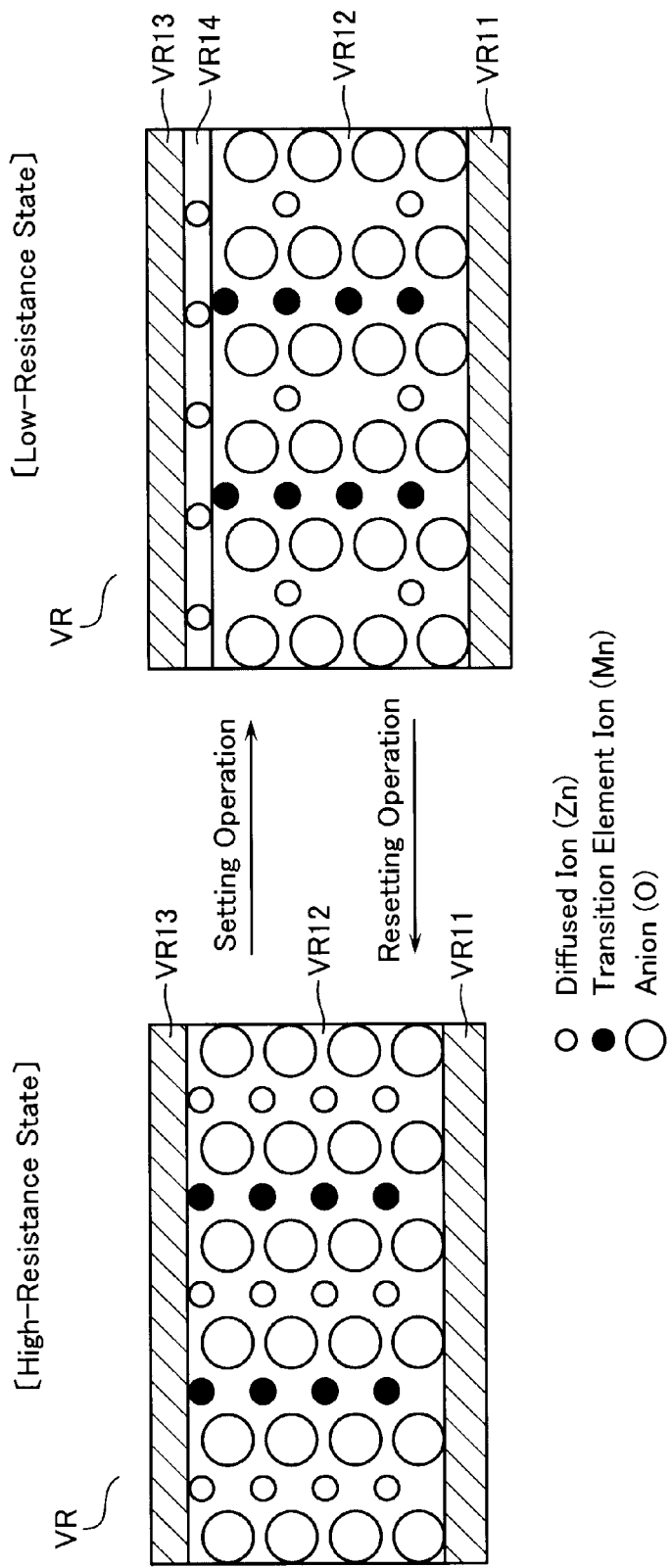
FIG. 5 is a schematic sectional view illustrating an example of a variable resistance element of a non-volatile semiconductor memory device according to the first embodiment.

FIG. 5 is a view illustrating an example of ReRAM. With the variable resistance element VR illustrated in FIG. 5, a recording layer VR12 is arranged between electrode layers VR11 and VR13. The recording layer VR12 is made of a complex compound containing at least two types of cationic elements. At least one type of cationic elements is a transition element incompletely filled with the electrons and including a d orbital, and the shortest distance between adjacent cationic elements is 0.32 mm or less. More specifically, the cationic element is represented by the chemical formula AxMyXz (A and M are respectively different elements), and is made of a material adopting a crystal structure such as a spinel structure ($AM_2O_4$), ilmenite structure ($AMO_3$), delafossite structure ($AMO_2$), $LiMoN_2$ structure ($AMN_2$), wolframite structure ($AMO_4$), olivine structure ($A_2MO_4$), hollandite structure ($AxMO_2$), ramsdellite structure ($A_xMO_2$) and perovskite structure ($AMO_3$).

With the example of FIG. 5, A is Zn, M is Mn and X is O. In the recording layer 12, small white circles represent diffuse ions (Zn), large white circles represent negative ions (O) and small black circles represent transition element ions (Mn). Although the initial state of the recording layer VR12 is a high-resistance state, when the fixed potential is applied to the electrode layer VR11 and a negative voltage is applied to the electrode layer VR13 side, part of diffuse ions in the recording layer 12 move to the electrode layer VR13 side and diffuse ions in the recording layer VR12 relatively decrease compared to the negative ions. The diffuse ions which move to the electrode layer VR13 side receive electrons from the electrode layer VR13, precipitate as metal and form a metal layer VR14. Inside the recording layer VR12, the negative ions become excessive and, as a result, lift the lower layer of the transition element ions inside the recording layer VR12. Consequently, the recording layer VR12 has electron conductivity by carrier injection, thereby completing the setting operation. Data may be read by flowing a very small current value which does not cause a resistance change in the material which makes the recording layer VR12. To reset the set state (low-resistance state) to the initial state (high-resistance state), a oxidation-reduction reaction of the recording layer VR12 only needs to be promoted by flowing a large current to, for example, the recording layer VR12 for a sufficient time and causing Joule heating. Further, the resetting operation can be performed by applying an inverse electric field compared to the setting operation.

[Configuration of Control Circuit]

Figure 6:
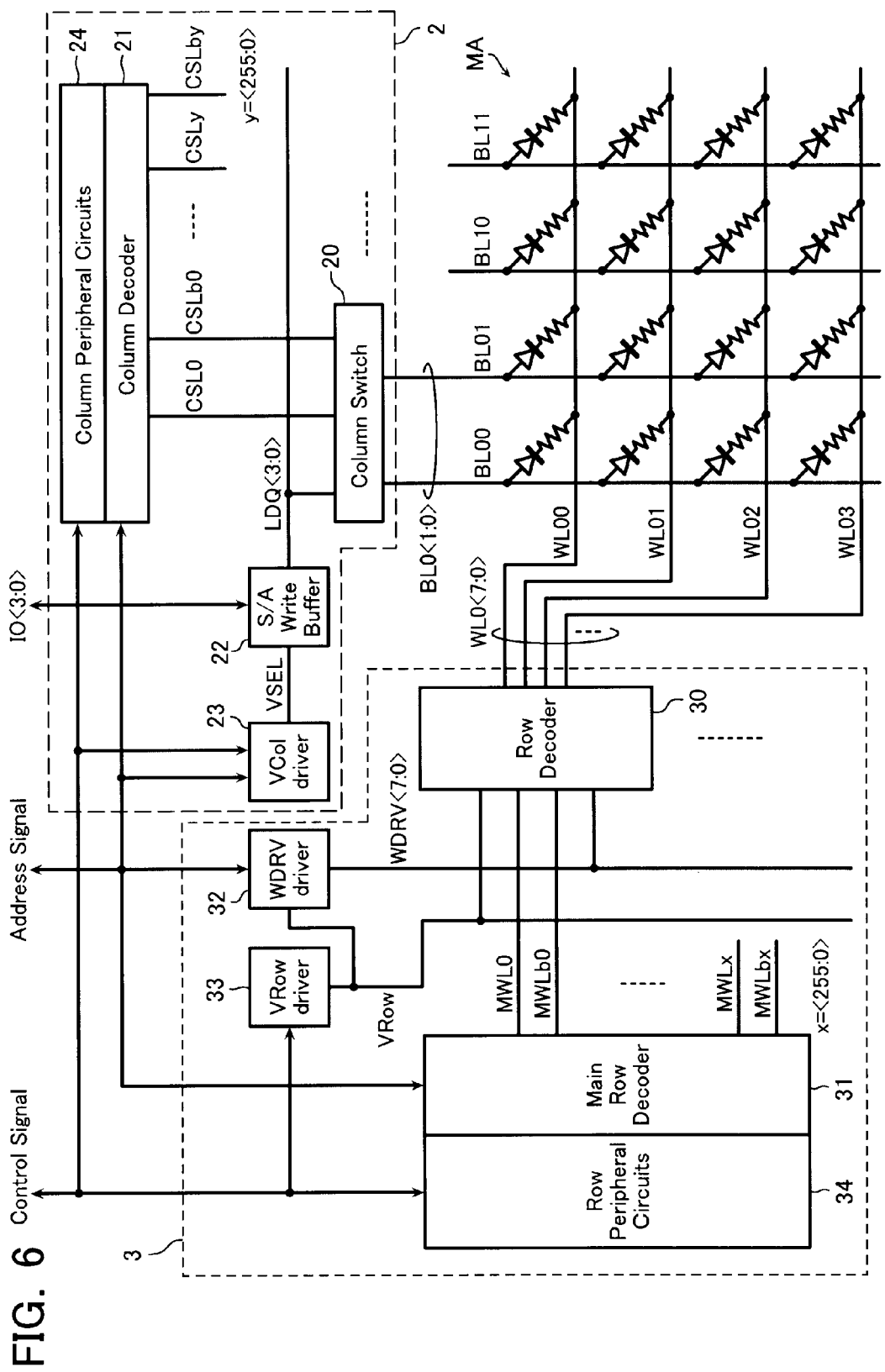
FIG. 6 is a block diagram illustrating an arrangement example of a column/row control circuit of a non-volatile semiconductor memory device according to the first embodiment.

Next, configurations of the memory cell array MA and peripheral circuits will be described with reference to FIG. 6. FIG. 6 is a block diagram illustrating in detail the memory cell array MA, column control circuit 2 and row control circuit 3 of the resistance change memory device. With the memory cell array MA illustrated in FIG. 6, for example, 2 Kbit (2048) unit memory cells MC are arranged in a direction in which the bit lines BL extend, and 512 bit unit memory cells MC are arranged in a direction in which the word lines WL extend. With this arrangement, 1 Mbit (about $10^6$) unit memory cells MC are arranged in one memory cell array MA.

As illustrated in FIG. 6, the row control circuit 3 is connected to the word lines WL of the memory cell array 1 and arranged. Further, the row control circuit 3 includes, for example, a row decoder 30, a main row decoder 31, a write drive line driver 32, a row power line driver 33 and row peripheral circuits 34. Further, the column control circuit 2 includes, for example, a column switch 20, a column decoder 21, a sense amplifier/write buffer 22, a column power line driver 23 and column peripheral circuits 24.

The word line WL according to the present embodiment adopts a layered structure, and the main row decoder 31 selects and drives one of 256 pairs of main word lines MWLx and MWLbx (x=<255:0>). When the main word line MWLx and MWLbx are selected, the main word line MWLx is placed in a "H" state and main word line MWLbx is placed in a "L" state. By contrast with this, when the main word lines MWLx and MWLbx are not selected, the main word lines MWLx are placed in the "L" state and main word lines MWLbx are placed in the "H" state. A pair of main word lines MWLx and MWLbx are connected to one row decoder 30. The row decoder 30 selects and drives one of word line group WLx <7:0> formed with eight word lines WL below the layer of the main word lines MWLx and MWLbx. The row decoder 30 connected to the main word lines MWLx and MWLbx which are selected and driven by the main row decoder 31 further selects and drives the word lines WL to select and drive one word line WL.

The write drive line driver 32 is connected to eight write drive lines WDRV <7:0> and row power line VRow, and the row power line driver 33 is connected with the row power line VRow. The write drive lines WDRV <7:0> and row power line VRow are connected to the row decoder 30. The voltage which the row decoder 30 applies to the word lines WL to drive is applied to the write drive lines WDRV <7:0> and row power line VRow. More specifically, a voltage Vss (=0 V) is supplied to one write drive line WDRV matching the selected word lines WL of the eight write drive lines WDRV <7:0> upon the resetting operation, and the voltage VRESET is supplied to the other seven write drive lines. Further, the voltage (VRESET) which is supplied to the word lines WL below the layer of the non-selected main word lines MWL and MWLbx is applied to the row power line VRow.

The row peripheral circuits 34 entirely manage this resistance change memory device and receive a control signal from an external host device, and perform forming, read, write and erase, and manage an input and output of data.

The column control circuit 2 according to the present embodiment also adopts a layered structure, and the column decoder 21 selects and drives a plurality of pairs of column selection lines CSLy and CSLby of 256 pairs of column selection lines CSLy and CSLby (y=<255:0>). For example, when the column selection lines CSLy and CSLby are selected, the column selection line CSLy is placed in the "H" state and the column selection line CSLby is placed in the "L" state. By contrast with this, when the column selection lines CSLy and CSLby are not selected, the column selection line CSLy is placed in the "L" state and the column selection line CSLby is placed in the "H" state. A pair of column selection lines CSLy and CSLby are connected to one column switch 20. The column switch 20 selects and drives bit line group BLy <1:0> formed with two bit lines BL below the layer of the column selection lines CSLy and CSLby. The column switch 20 connected to the column selection lines CSLy and CSLby which are selected and driven by the column decoder 21 further selects and drives the bit lines BL to select and drive the bit lines BL.

The sense amplifier/write buffer 22 is connected with four local data lines LDQ <3:0>. These local data lines LDQ <3:0> are classified into sets of two local data lines LDQ <1:0> or LDQ <3:2>, and are connected with the column switch 20. One set of the local data lines LDQ <1:0> or LDQ <3:2> is connected to one column switch 20. The sense amplifier/write buffer 22 detects and amplifies a signal read in the local data lines LDQ <3:0>, and supplies write data input from the data input/output line IO <3:0> to the memory cells MC through the column switch 20. The voltage which the column switch 20 applies to the bit lines BL to drive is applied to the local data lines LDQ <3:0>. More specifically, the voltage VRESET is supplied to the four local data lines LDQ <3:0> upon the resetting operation. The sense amplifier/write buffer 22 is connected with the column power line driver 23 through a column power line VCol1. The column power line driver 23 receives an input of an address signal, and can adjust an output voltage according to position information of a selected memory cell.

The column peripheral circuits 24 entirely manage this resistance change memory device and receive a control signal from an external host device, and perform forming, read, write and erase and manage an input and output of data.

[Voltage Application Operation]
[Forming Operation]

Figure 7:
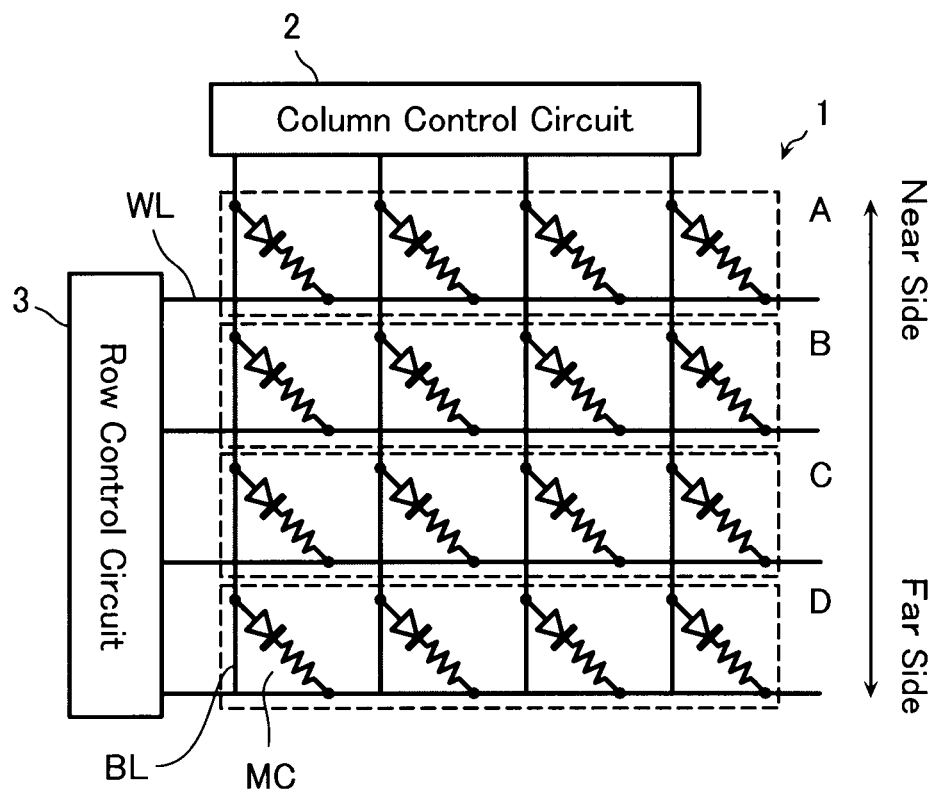
FIG. 7 is an equivalent circuit of part of a memory cell array of a non-volatile semiconductor memory device according to the first embodiment.

Next, the forming operation of the non-volatile semiconductor memory device configured in this way will be described with reference to FIGS. 7 to 9. FIG. 7 shows an equivalent circuit of part of a memory cell array. Further, FIGS. 8 and 9 are views for describing the forming operation for the memory cells MC.

Upon forming, the bit lines BL connected to the memory cells MC of the forming target have a high voltage and the word lines WL have a low voltage, and the other bit lines BL and word lines WL are placed in a floating state. When forming is finished, application of the voltage to the target memory cell MC is immediately stopped.

With the forming operation according to the present embodiment, forming is performed in order from a memory cell MC arranged on a side far from the column control circuit 2 (hereinafter "Far side") to the memory cell MC on a side close to the column control circuit 2 (hereinafter, "Near side") on the same bit line BL. When, for example, memory cells connected to same bit lines BL are classified into A to D groups from the Near side to the Far side as illustrated in FIG. 7, forming is performed sequentially from the D group to the A group. In addition, in this case, forming may be performed at the same time with respect to the memory cells belonging to the same group, or may be individually performed to the memory cell.

Figure 8:
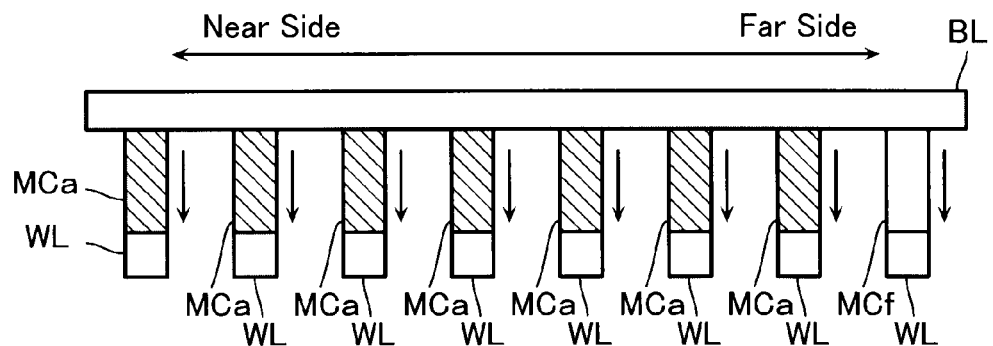
FIG. 8 is a view for describing a forming operation of a non-volatile semiconductor memory device according to a comparison example.
Figure 9:
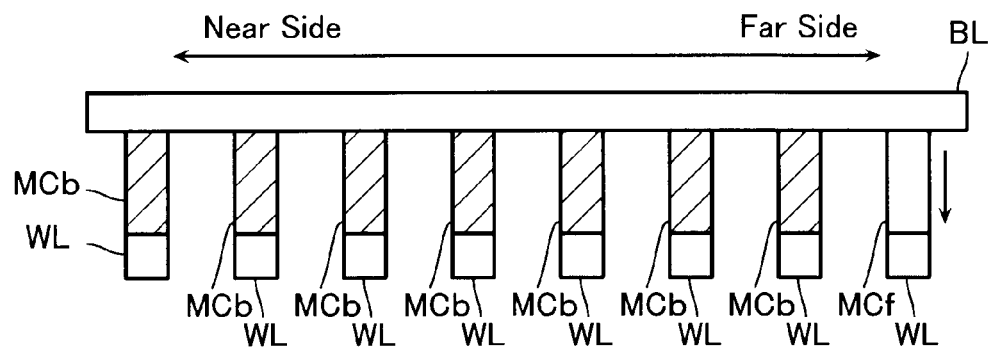
FIG. 9 is a view for describing a forming operation of a non-volatile semiconductor memory device according to the first embodiment.

FIGS. 8 and 9 illustrate a plurality of memory cells MC arranged on the same bit lines BL. Further, FIG. 8 illustrates the state when forming is performed sequentially from the Near side to the Far side, and FIG. 9 illustrates the state when forming is performed sequentially from the Far side to the Near side. In FIG. 8, forming is performed sequentially from the memory cell on the Near side, and therefore, when forming is performed for the memory cell on the Far side, forming is finished for all of the memory cells MCa closer to the Near side than the memory cell MCf which is the forming target. Hence, the voltage decreases due to the leak current flowing in the memory cell MCa and wiring resistance of the bit lines BL, and the voltage to be applied to the target memory cell MCf decreases. Therefore, the voltage or time produced for the forming operation increases. Hence, stress is produced in the memory cells arranged closer to the Near side than the target memory cell MCf due to application of the voltage. Further, when the produced voltage or time required for forming increases, there is a problem that a consumption current increases due to the leak current.

By contrast with this, when the forming operation is performed sequentially from the memory cell MCf on the Far side to the memory cells MC on the Near side as illustrated in FIG. 9, the forming operation is not performed with respect to the memory cell MCb closer to the Near side than the target memory cell MCf when the forming operation is performed for the target memory cell MCf. Hence, little leak current flows to the memory cell MCb and the voltage in the bit lines BL decreases, and therefore the voltage and time required for the forming operation are reduced.

[Setting Operation and Resetting Operation]

The setting operation is performed by applying about 4.5 V to the selected bit lines BL connected with the target memory cell MC, about ground voltage to the selected word lines WL connected with the target memory cells MC, about ground voltage to the non-selected bit lines BL, and about 4.5 V to the non-selected word lines, and applying the set voltage of about 4.5 V to the target memory cells MC for about 10 ns to 100 ns. By this operation, the variable resistance elements VR change from a high-resistance state to a low-resistance state.

By contrast with this, the resetting operation is performed by applying about 1.8 V to the selected bit lines BL connected with the target memory cells MC, about ground voltage to the selected word lines WL connected with the target memory cells MC, about ground voltage to the non-selected bit lines BL, and about 1.8 V to the non-selected word lines, and applying about 1.8 V of the reset voltage to the target memory cells MC for the time of about 500 ns to 2 μs and flowing the current of about 1 μA to 10 μA. By this operation, the variable resistance elements VR change from a low-resistance state to a high-resistance state.

In the present embodiment, similar to the above forming operation, the setting operation and resetting operation are also sequentially performed from the memory cell on the Far side to the memory cell on the Near side. In this case, to apply a desired set voltage or reset voltage to the memory cell MCs closest to the Far side, the voltage decreases due to wiring resistance from the Near side to the Far side and the voltage supplied from the Near side needs to be set higher for the memory cell MCs which is farther from the Near side and which is a set or reset target. Hence, following transition of the setting operation or resetting operation target memory cells from the memory cell on the Far side to the memory cell on the Near side, the column control circuit 2 or row control circuit 3 preferably decreases the applied voltage of the setting or resetting operation target memory cell MC gradually.

Figure 10:
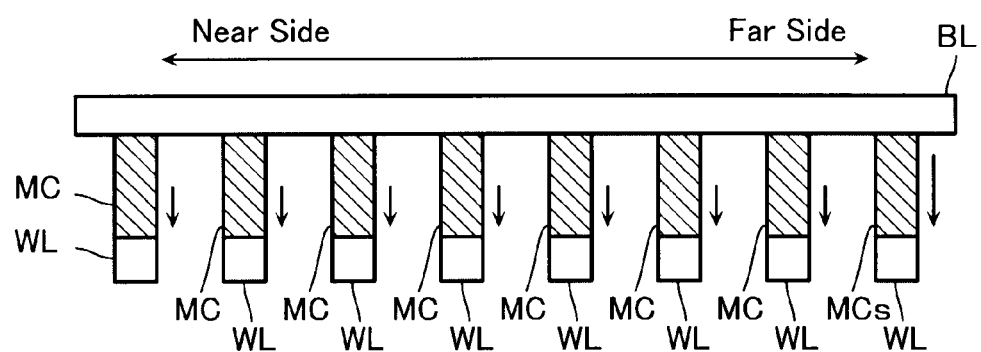
FIG. 10 is a view for describing a setting operation and a resetting operation of a non-volatile semiconductor memory device according to the first embodiment.

FIG. 10 illustrates how a setting operation is performed with respect to the memory cell MCs arranged closest to the Far side among a plurality of memory cells MC arranged on the same bit line BL. A voltage of certain degree is applied to memory cells arranged closer to the Near side than the setting operation or resetting operation target memory cell MCs due to the applied voltage of non-selected WL. The degree is large enough such that the memory cell MC on the Far side is the target memory cell MCs. This causes an error setting or error resetting which changes the state of the memory cells MC closer to the Near side than the setting operation or resetting operation target memory cell MCs.

However, in the present embodiment, the setting operation or resetting operation is sequentially performed from the memory cell on the Far side to the memory cell on the Near side, so that it is possible to maintain data without an error by rewriting a memory cell MC in which an error setting or error resetting occurs.

Further, in this case, following transition of the setting operation or resetting operation target memory cells from the memory cell on the Far side to the memory cell on the Near side, when the column control circuit 2 or row control circuit 3 preferably decreases the applied voltage for the setting operation or resetting operation target memory cell gradually, it is possible to provide an effect of reducing power consumption.

[Second Embodiment]

In the second embodiment, position information of a memory cell MC for which a setting operation or a resetting operation is performed is output as a flag.

Figure 11:
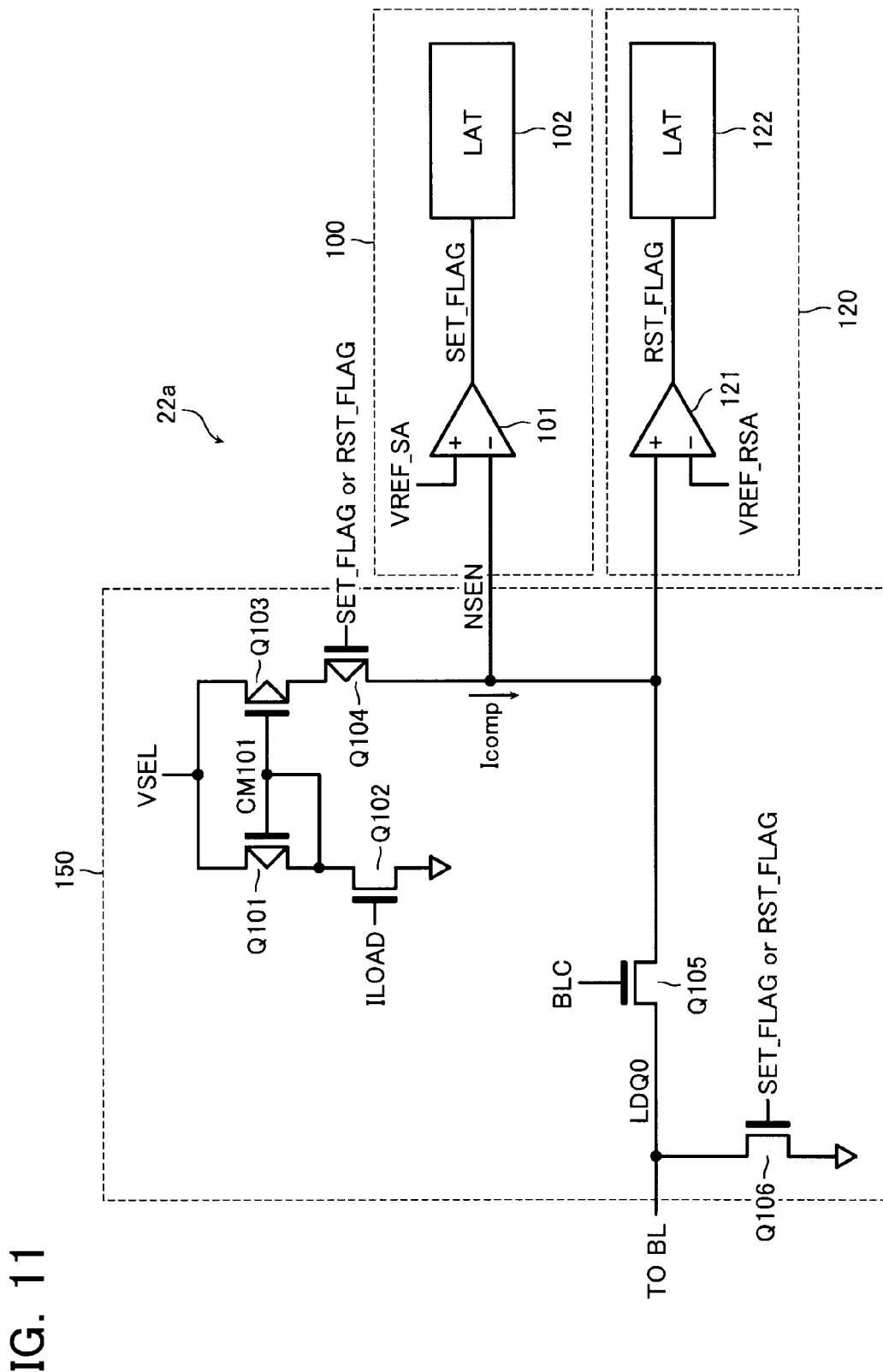
FIG. 11 is a circuit diagram illustrating a configuration example of part of a column control circuit of a non-volatile semiconductor memory device according to a second embodiment.

FIG. 11 is a circuit diagram illustrating a set/reset circuit 22a which generates a set flag and reset flag for realizing the present embodiment. This set/reset circuit 22a is provided inside the sense amplifier/write buffer 22 in the column control circuit 2.

The set/reset circuit 22a includes a set state detection circuit 100, a reset state detection circuit 120 and a voltage supply circuit 150.

The voltage supply circuit 150 has a PMOS transistor Q101 and a NMOS transistor Q102 connected in series between a power voltage VSEL terminal and a ground terminal. The power voltage VSEL terminal is connected to the column power line driver 23, and receives a supply of the set voltage or reset voltage matching the position of the selected memory cell. Further, the gate of the transistor Q102 receives an input of a load current signal ILOAD. In this manner, the transistors Q101 and Q102 form a constant current circuit. Further, the voltage supply circuit 150 has PMOS transistors Q103 and Q104 connected in series between the power voltage VSEL terminal and sense node NSEN in parallel to this constant current circuit. The transistor Q103 is used in combination with the transistor Q101 to form a current mirror circuit CM101. Further, the voltage supply circuit 150 has a voltage clamp NMOS transistor Q105 between the sense node NSEN and node LDQ0 connected to the bit lines BL. The gate of this transistor Q105 receives a clamp voltage BLC. Consequently, the voltage of the bit lines BL is clamped. Furthermore, the voltage supply circuit 150 has a NMOS transistor Q106 connected between a node LDQ0 and ground terminal. When this NMOS transistor Q106 is turned on, the voltage of the bit lines BL is discharged.

The set state detection circuit 100 has a comparator 101 which compares the voltage of a sense node NSEN on an anode side of a diode of the memory cell MC, and a predetermined reference voltage VREF_SA. During the setting operation, the set/reset circuit 22a flows a constant cell current to the memory cells MC. In this case, the decrease in the resistance state of the variable resistance elements of the memory cells MC leads to the decrease in the voltage of the sense node NSEN. The set state detection circuit 100 detects that the memory cells MC are placed in the set state by detecting that the voltage of this sense node NSEN becomes the reference voltage VREF_SA or less using the comparator 101. This detection result is output as a set flag SET_FLAG, and this set flag SET_FLAG is held in the latch circuit 102. The set flag SET_FLAG held in the latch circuit 102 is input to the base of the transistors Q104 and Q106 of the voltage supply circuit 150. Therefore, when the set flag SET_FLAG becomes "H", the transistor Q104 is turned off, and the voltage supply circuit 150 stops supplying the power voltage VSEL to the selected memory cell. Further, the transistor Q106 is turned on, and the voltage of the bit lines BL is discharged.

The reset state detection circuit 120 employs almost the same configuration as the set state detection circuit 100, and has a comparator 121 which compares the voltage of a sense node NSEN on an anode side of a diode of the memory cells MC and a predetermined reference voltage VREF_RSA. During the resetting operation, the set/reset circuit 22a flows a constant cell current to the memory cells MC. In this case, the increase in the resistance state of the variable resistance elements of the memory cells MC leads to the increase in the voltage of the sense node NSEN. The reset state detection circuit 120 detects that the memory cells MC are placed in the reset state by detecting that the voltage of this sense node NSEN becomes the reference voltage VREF_RSA or more using the comparator 121. This detection result is output as a reset flag RST_FLAG, and this reset flag RST_FLAG is held in the latch circuit 122. The reset flag RST_FLAG held in the latch circuit 122 is input to the base of the transistors Q104 and Q106 of the voltage supply circuit 150. Therefore, when the reset flag RST_FLAG becomes "H", the transistor Q104 is turned off, and the voltage supply circuit 150 stops supplying the power voltage VSEL to the selected memory cell. Further, the transistor Q106 is turned on, and the voltage of the bit lines BL is discharged.

Further, the set flag SET_FLAG and reset flag RST_FLAG held in the latch circuits 102 and 122 are output to the external controller 10 through the data input/output buffer 4 in parallel or in serial predetermined bits by predetermined bits, and are held in the buffer 4 or external controller 10.

According to the present embodiment, it is possible to recognize as invalid data the memory cells arranged closer to the Near side than the setting operation or resetting operation target memory cell. Therefore, it is possible to recognize only data which needs to be rewritten, and provide a high-speed operation.

In addition, although, in the above embodiments, the word lines WL are selected from the Far side to the Near side of the bit lines BL using the bit lines BL as the first lines, the word lines WL as the second lines, column decoder 21 as the first decoder and row decoder 30 as the second decoder, the bit lines BL may be selected from the Far side to the Near side of the word lines WL using the word lines WL as the first lines, bit lines BL as the second lines, row decoder 30 as the first decoder and column decoder 21 as the second decoder.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a memory cell array which comprises a plurality of first lines, a plurality of second lines intersecting the plurality of first lines and a plurality of memory cells which are arranged at each intersection part of the plurality of first and second lines and which store an electrically rewritable resistance value as data in a non-volatile manner;
    a first decoder which is connected to one ends of the plurality of first lines and selects the first lines;
    a second decoder which is connected to one ends of the plurality of second lines and selects the second lines; and
    a voltage applying circuit which is connected to one of the first decoder and the second decoder and which applies a predetermined voltage between the first lines and the second lines selected by the first decoder and the second decoder,
    the second decoder sequentially selecting the second lines in a direction from the other ends of the first lines to the one ends of the first lines.

2. The non-volatile semiconductor memory device according to claim 1, wherein the voltage applying circuit decreases the applied voltage according to selection of the second lines by the second decoder in the direction from the other ends of the first lines to the one ends of the first lines.

3. The non-volatile semiconductor memory device according to claim 1, wherein the first decoder selects two or more of the first lines at the same time.

4. The non-volatile semiconductor memory device according to claim 1, wherein the voltage applying circuit applies the voltage for forming a variable resistance element between the first lines and the second lines selected by the first decoder and the second decoder.

5. The non-volatile semiconductor memory device according to claim 1, wherein the voltage applying circuit applies a voltage for setting or a voltage for resetting a variable resistance element between the first lines and the second lines selected by the first decoder and the second decoder.

6. The non-volatile semiconductor memory device according to claim 5, wherein the voltage applying circuit outputs a flag when finishing setting or resetting the memory cells.

7. The non-volatile semiconductor memory device according to claim 5, wherein the voltage applying circuit outputs a flag when finishing setting or resetting the memory cells, and finishes applying a voltage to the memory cells according to the flag.

8. A non-volatile semiconductor memory device comprising:
    a memory cell array which comprises a plurality of first lines, a plurality of second lines intersecting the plurality of first lines and a plurality of memory cells which are arranged at each intersection part of the plurality of first and second lines and which store an electrically rewritable resistance value as data in a non-volatile manner;
    a first decoder which is connected to one ends of the plurality of first lines and selects the first lines;
    a second decoder which is connected to one ends of the plurality of second lines and selects the second lines; and
    a voltage applying circuit which is connected to at least one of the first decoder and the second decoder and which applies a predetermined voltage between the first lines and the second lines selected by the first decoder and the second decoder,
    the second lines grouped into a plurality of groups in a direction in which the first lines extend, and
    the second decoder sequentially selecting a group of the second lines in a direction from the other ends to the one ends of the first lines.

9. The non-volatile semiconductor memory device according to claim 8, wherein the voltage applying circuit decreases the applied voltage according to selection of the group of the second lines by the second decoder in the direction from the other ends of the first lines to the one ends of the first lines.

10. The non-volatile semiconductor memory device according to claim 8, wherein the first decoder selects two or more of the first lines at the same time.

11. The non-volatile semiconductor memory device according to claim 8, wherein the voltage applying circuit applies the voltage for forming a variable resistance element between the first lines and the second lines selected by the first decoder and the second decoder.

12. The non-volatile semiconductor memory device according to claim 8, wherein the voltage applying circuit applies a voltage for setting or a voltage for resetting a variable resistance element between the first lines and the second lines selected by the first decoder and the second decoder.

13. The non-volatile semiconductor memory device according to claim 12, wherein the voltage applying circuit outputs a flag when finishing setting or resetting the memory cells.

14. The non-volatile semiconductor memory device according to claim 12, wherein the voltage applying circuit outputs a flag when finishing setting or resetting the memory cells, and finishes applying a voltage to the memory cells according to the flag.

15. A method of controlling a non-volatile semiconductor memory device which comprises:
    a memory cell array which comprises a plurality of first lines, a plurality of second lines intersecting the plurality of first lines and a plurality of memory cells which are arranged at each intersection part of the plurality of first and second lines and which store an electrically rewritable resistance value as data in a non-volatile manner,
    the method comprising:
    selecting the plurality of first lines by a first decoder connected with one ends of the first lines;
    selecting the plurality of second lines by a second decoder connected with one ends of the second lines; and
    with a voltage applying circuit, applying a predetermined voltage to memory cells between the first and second lines selected by the first decoder and the second decoder, wherein
    the second lines are sequentially selected by the second decoder in a direction from the other ends of the first lines to the one ends of the first lines.

16. The method of controlling a non-volatile semiconductor memory device according to claim 15, wherein, with the voltage applying circuit, the applied voltage is decreased according to selection of the second lines by the second decoder in the direction from the other ends of the first lines to the one ends of the first lines.

17. The method of controlling a non-volatile semiconductor memory device according to claim 15, wherein the first decoder selects two or more of the first lines at the same time.

18. The method of controlling a non-volatile semiconductor memory device according to claim 15, wherein the control method for the non-volatile semiconductor memory device is used for forming a variable resistance element.

19. The method of controlling a non-volatile semiconductor memory device according to claim 15, wherein the control method for the non-volatile semiconductor memory device is used for setting or resetting a variable resistance element.

20. The method of controlling a non-volatile semiconductor memory device according to claim 19, wherein the voltage applying circuit outputs a flag when finishing setting or resetting the memory cells.

* * * * *